(12) United States Patent
Kato (10) Patent No.: US 9,417,517 B2
(45) Date of Patent: Aug. 16, 2016

(54) PHOTOMASK HAVING A BLIND REGION INCLUDING PERIODICAL CLEAR PORTIONS

(71) Applicant: Micron Technology, Inc., Boise, ID (US)

(72) Inventor: Katsuya Kato, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 14/300,416

(22) Filed: Jun. 10, 2014

(65) Prior Publication Data

US 2015/0004532 A1 Jan. 1, 2015

(30) Foreign Application Priority Data

Jun. 27, 2013 (JP) ................................. 2013-135194

(51) Int. Cl.
*G03F 1/38* (2012.01)
*G03F 1/50* (2012.01)

(52) U.S. Cl.
CPC ... *G03F 1/38* (2013.01); *G03F 1/50* (2013.01)

(58) Field of Classification Search
CPC ..................................... G03F 1/38; G03F 1/50
USPC .............................................................. 430/5
See application file for complete search history.

(56) References Cited

U.S. PATENT DOCUMENTS

2009/0323039 A1 12/2009 Wardenier
2012/0009510 A1 1/2012 Kawano

FOREIGN PATENT DOCUMENTS

JP  2012-022036  2/2012

OTHER PUBLICATIONS

Driving Imaging and Overlay Performance to the Limits with Advanced Lithography Optimization; Mulkens et al.; Proc. of SPIE, vol. 8326; 2012 SPIE; pp. 832611-1-832611-15.

*Primary Examiner* — Christopher Young
(74) *Attorney, Agent, or Firm* — Wells St. John, P.S.

(57) ABSTRACT

A photo mask includes a plurality of dark patterns disposed on a transparent substrate, a first region, a shield region, and a second region. The first region includes the dark patterns that are disposed with a wider space than a first distance. The shield region is adjacent to the first region on the transparent substrate and is filled with the dark pattern. The second region is faced to the first region across the shield region and includes the dark patterns that are disposed with a narrower space than a second distance. The second distance is narrower than ninety percent of the first distance.

20 Claims, 11 Drawing Sheets

PHOTOMASK HAVING A BLIND REGION INCLUDING PERIODICAL CLEAR PORTIONS

This application is based upon and claims the benefit of priority from Japanese patent application No. 2013-135194, filed on Jun. 27, 2013, the disclosure of which is incorporated herein in its entirety by reference.

BACKGROUND OF THE INVENTION

1. Field of the Invention

The present invention relates to a lithography photo mask for use in manufacturing a semiconductor device.

2. Description of Related Art

With high integration of the semiconductor integrated circuit in recent years, a pattern size also become fine, alignment accuracies between the pattern and a base become an issue in lithography. Therefore, numerous studies have been made as regards a technique for improving the alignment accuracy.

Among them, thermal expansion in an exposure process of a photo mask (a reticle) is one of factors for deteriorating the alignment accuracy. More specifically, the photo mask (the reticle) comprises a mask substrate (a reticle substrate) composed of a transparent substrate, and a dark film (a dark portion) which is provided on the mask substrate (the reticle substrate) and which has either a function for shielding light or a function for passing through the light partially. Absorption energy from a radiation beam during exposure heats the photo mask (the reticle) to make the photo mask (the reticle) expand. Under the circumstances, when there is any bias in distribution of an arrangement of the dark film (the dark portion) on the mask substrate (the reticle substrate), bias occurs in absorption heating value, and then the accuracy of the alignment accuracy becomes worse due to bias expansion of the mask substrate (the reticle substrate).

In order to resolve this problem, US 2009/0323039 A1 (which will later be called "Patent Literature 1") discloses a correction method comprising: calculating thermal expansion of a photo mask (a reticle) using a model calculation; and correcting it using a high-order correction technique.

Although the correction method disclosed in Patent Literature 1 corrects the thermal expansion of the reticle using the high-order correction technique, the correction method merely corrects fluctuations of the shape of a complicated reticle due to the thermal expansion approximately using a different overlap correction technique such as a scanning rate adjustment. Therefore, the correction method disclosed in Patent Literature 1 cannot perfectly correct the thermal expansion of the reticle (residues persist).

In addition, temperature control technology of a photo mask (a reticle) is disclosed in article which is contributed by J. Mulkens et al. to Proc. of SPIE Vol. 8326 (2012), pages 12-14, and which has a title of "Driving Imaging and Overlay Performance to the Limits with Advanced Lithography Optimization" (which will later be called "Non Patent Literature 1").

However, Non Patent Literature 1 merely discloses the temperature control technology of the photo mask (the reticle).

Furthermore, JP-A-2012-22036 (which corresponds to US 2012/0009510 A1 and which will later be called "Patent Literature 2") discloses a lithography mask. The lithography mask disclosed in Patent Literature 2 is composed of a transparent substrate and a light blocking film or a dark film. The light blocking film (the dark film) includes a first patterning region and a second patterning region located adjacent to the first patterning region. The first patterning region corresponds to a sizable unpatterned region of a resist film, whereas the second patterning region corresponds to a patterned region of the resist film.

In the lithography mask disclosed in Patent Literature 2, if the first patterning region is adjacent to the second patterning region, the second patterning region in proximity to the first patterning region become over-exposure locally due to diffraction of the light. It therefore causes problem so that dimensional accuracy of a transferred pattern becomes worse.

Although a technique for suppressing the thermal expansion of the photo mask (the reticle) is fundamentally required, any proposal of such a technique does not be made conventionally.

SUMMARY

The present invention seeks to solve one or more of the above problems, or to improve upon those problems at least in part.

According to a first aspect of the present invention, there is provided a photo mask comprising: a plurality of dark patterns disposed on a transparent substrate; a first region including the dark patterns that are disposed with a wider space than a first distance; a shield region, adjacent to the first region on the transparent substrate, being filled with the dark pattern; and a second region, faced to the first region across the shield region, including the dark patterns that are disposed with a narrow space than a second distance, wherein the second distance is narrower than ninety percent of the first distance.

According to a second aspect of the present invention, there is provided a photo mask comprising: a transparent substrate including first, second, and third regions, the third region adjacent to the first region, the first and the second regions facing each other across the third region; first dark patterns that are arranged with a first pitch in the first region; second dark patterns that are arranged with a second pitch in the second region; and a third dark pattern filling in the third region, wherein the second pitch is narrower than ninety percent of the first pitch.

According to a third aspect of the present invention, there is provided a photo mask comprising: a first region including a plurality of first clear portions having a minimum size; a dark region surrounding the first region; and a second region surrounding the dark region and including a plurality of second clear portions having a maximum size that is smaller than ninety percent of at least the minimum size.

BRIEF DESCRIPTION OF THE DRAWINGS

The above features and advantages of the present invention will be more apparent from the following of certain preferred embodiments taken in conjunction with the accompanying drawings, in which.

DETAILED DESCRIPTION OF THE EMBODIMENTS

Referring now to drawings, the description will proceed to a lithography photo mask to which the present invention is applied and a method of manufacturing a semiconductor device thereto into details. The drawings used in the following description may show by enlarging characterized parts for the sake of convenience in order to facilitate characteristics, the ratios of dimensions of respective constituent elements and so on are not necessarily the same in actuality. In addition, materials, dimensions, and so on exemplified in the following description are examples, and the present invention is not always limited to them and may implement by appropriately changing without changing gist thereof.

The description will proceed to a layout of respective components by setting a coordinate system of xyz. In the coordinate system, the z direction is a direction orthogonal to a surface of a wafer, the x direction is a direction orthogonal to the z direction in a plane parallel to the surface of the wafer, and the y direction is a direction orthogonal to the x direction in the plane parallel to the surface of the wafer. Among this specification, the y direction is referred to as a first direction, the x direction is referred to as a second direction, and the z direction is referred to as a third direction.

Figure 1:
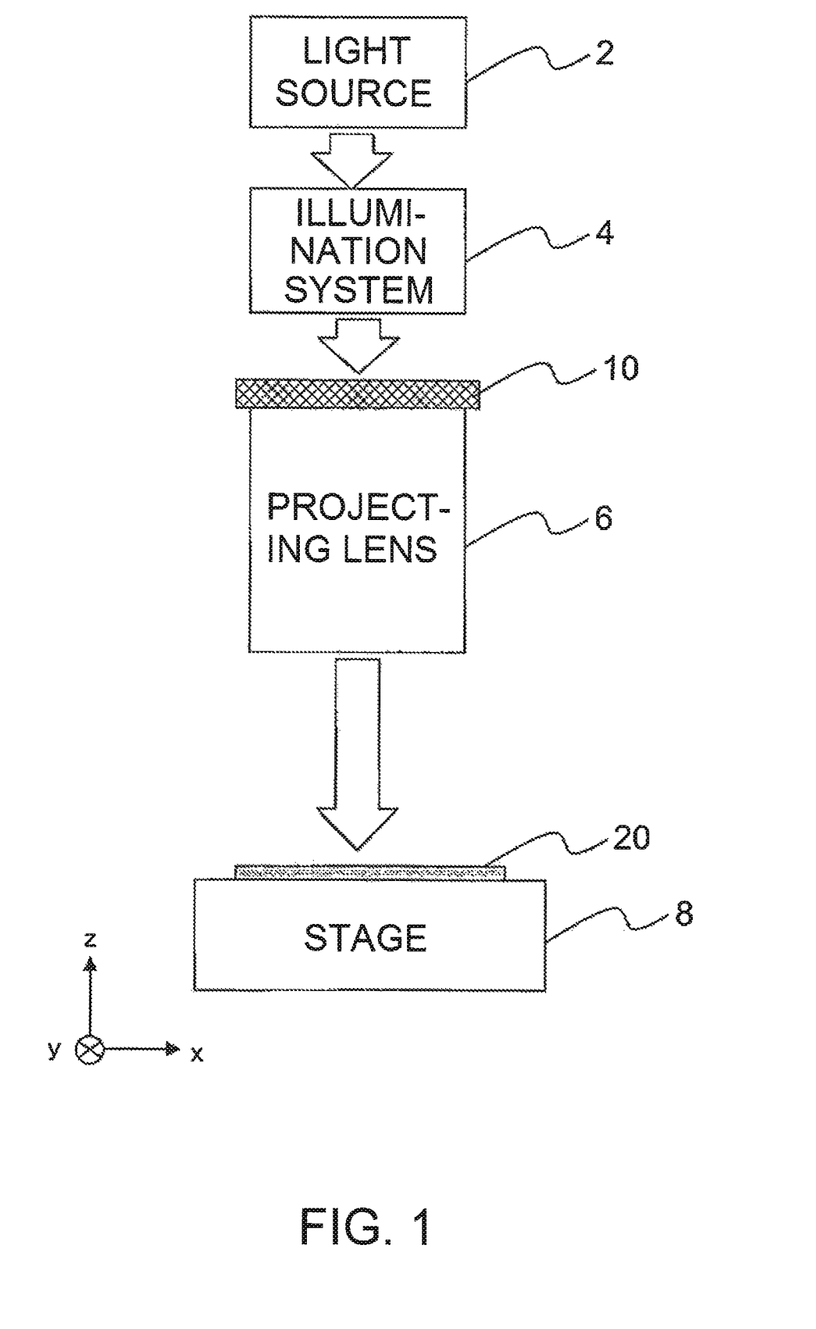
FIG. 1 is a schematic construction view illustrating an exposure apparatus in which a photo mask (a reticle) to which the present invention is applied is mounted.

FIG. 1 is a schematic construction view illustrating an exposure apparatus in which a photo mask (a reticle) to which the present invention is applied is mounted.

First, referring to FIG. 1, the exposure apparatus comprises a light source 2, an illumination system 4, a projecting lens 6, and a stage 8. Inserted on exposure, a photo mask 10 is disposed between the illumination system 4 and the projecting lens 6. A wafer 20 to which a photoresist (a photosensitive organic film) is applied is disposed on an upper surface of the stage 8. The light source 2 comprises an ArF excimer laser (a designed wavelength of light: 193 nm). The illumination system 4 comprises, as an aperture plate (not shown), an aperture portion for a cross-pole illumination. The exposure apparatus may comprise a limmersion exposure apparatus (numerical aperture NA: 0.92) including the ArF excimer laser. Thereafter, the photo mask 10 is called as a "reticle" used in a reduced projection exposure.

In this example, it will be assumed that a size (a dimension) of a pattern formed in the photo mask (the reticle) 10 is reduced to a quarter or (¼) and is transferred to the photoresist (the photosensitive organic film) on the wafer 20. That is, a transferring factor is equal to a quarter or (¼).

A desired dark pattern is disposed in the photo mask (the reticle) 10. The wafer 20 is also called a semiconductor substrate. A semiconductor device is generally manufactured in the manner as follows.

First, a work layer (not shown) is formed on the semiconductor substrate 20. Subsequently, a photoresist (a photosensitive organic film) is formed on the work layer. The photosensitive organic film on the semiconductor substrate 20 is exposed by using, as a mask, a photo mask 10 in which a desired dark pattern is disposed. The exposed photosensitive organic film is developed to form a first pattern where a part of the photosensitive organic film is selectively removed. Thereafter, the above-mentioned work layer is selectively removed by using the first pattern as a mask.

Figure 2:
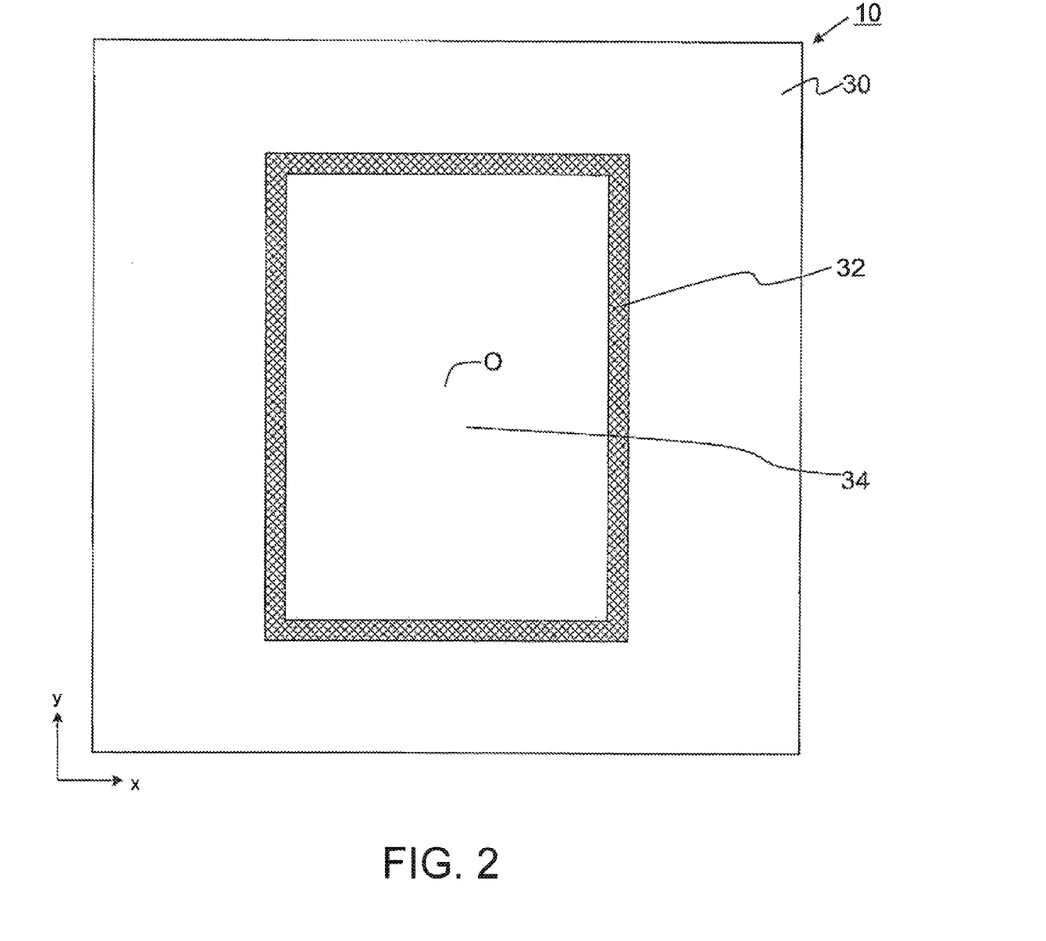
FIG. 2 is a plan view illustrating the photo mask (the reticle) shown in FIG. 1.

FIG. 2 is a plan view illustrating the reticle 10 inserted on exposure.

Herein, the description will proceed on the assumption that the illustrated reticle 10 comprises a binary mask and the photoresist (the photosensitive organic film) applied to the wafer 20 (FIG. 1) is a positive type.

As shown in FIG. 2, the reticle 10 comprises a reticle substrate 30, a rectangular ring-shaped dark band 32, and a rectangular exposure region 34. The reticle substrate 30 comprises a transparent substrate such as a glass or the like. The dark band 32 is provided on a lower surface of the reticle substrate 30 and is made of, for example, chrome (Cr). The rectangular exposure region 34 is formed in the dark band 32. In other words, the rectangular exposure region 34 is enclosed with the dark band 32. The exposure region 34 has a rectangular shape which is long in the y direction (the first direction). The reticle substrate 30 is also called a mask substrate.

Before describing the present invention, the related arts will be explained in detail with reference to FIGS. 3 to 6 in order to facilitate the understanding the present invention.

[Related Art 1]

Figure 3:
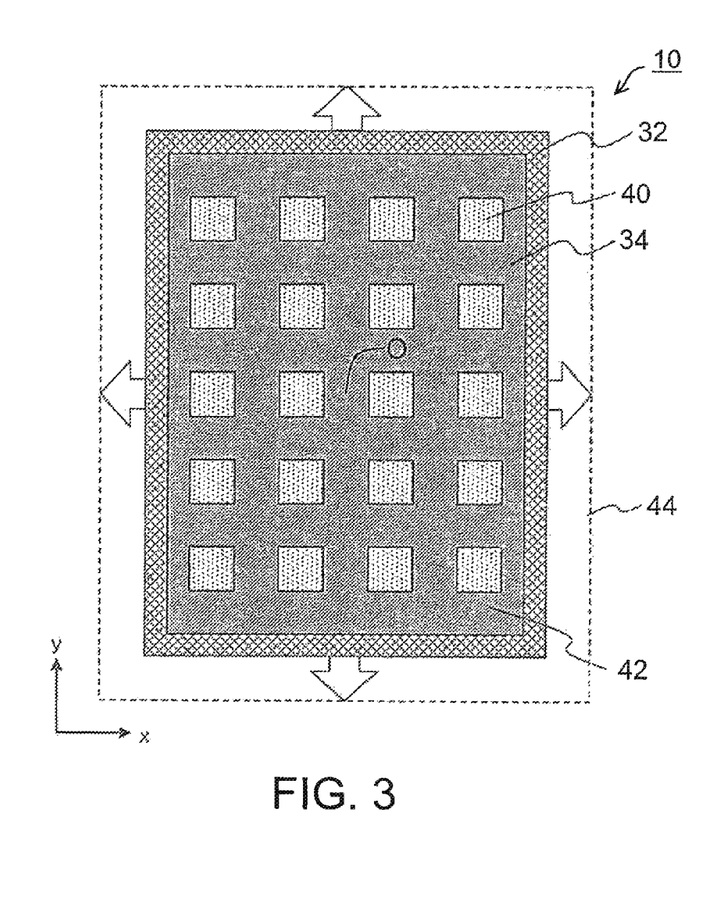
FIG. 3 is an enlarged plan view illustrating a detailed configuration of a reticle in a first related art.

FIG. 3 is an enlarged plan view illustrating a detailed configuration of the photo mask (the reticle) 10 (the rectangular exposure region 34 enclosed with the dark band 32) in a first related art.

In the photo mask (the reticle) 10 according to the first related art, the exposure region 34 comprises a plurality of circuit formation regions 40 and a dark region 42. The plurality of circuit formation regions 40 are disposed at regular intervals in length and width directions (in the y direction and the x direction) in a matrix fashion. The dark region 42 is disposed around each of the plurality of circuit formation region 40. That is, each circuit formation region 40 is enclosed with the dark region 42. Accordingly, in the exposure region 34 of the reticle according to the first related art, the plurality of circuit formation regions 40 are disposed so as to be symmetric with respect to a central point O of the reticle substrate 30 (FIG. 2). In the example being illustrated, each circuit formation region 40 has a rectangular shape. Each circuit formation region 40 is also called a first region while the dark region is also called a second region.

It will be assumed that a radiation beam is irradiated to the reticle (the photo mask) 10 including the exposure region 34 according to the first related art during exposure. Under the circumstances, in the reticle substrate 30 (FIG. 2), as shown in arrows of FIG. 3, the dark band 32 and the rectangular exposure region 34 enclosed therewith expand uniformly in the length and width directions (the y direction and the x direction) up to a rectangular region 44 depicted at a broken line of FIG. 3. The rectangular region 44 depicted at the broken line is an enlarged amount of the reticle substrate. The reason why the reticle substrate 30 expands uniformly in the length and width directions is that the plurality of circuit formation regions 40 are disposed so as to be symmetric with respect to the central point O.

As described above, with the structure of the reticle 10 according to the first related art, it is impossible to suppress the thermal expansion of the reticle substrate 30 (FIG. 2) due to absorption heating of the radiation beam.

[Related Art 2]

Figure 4:
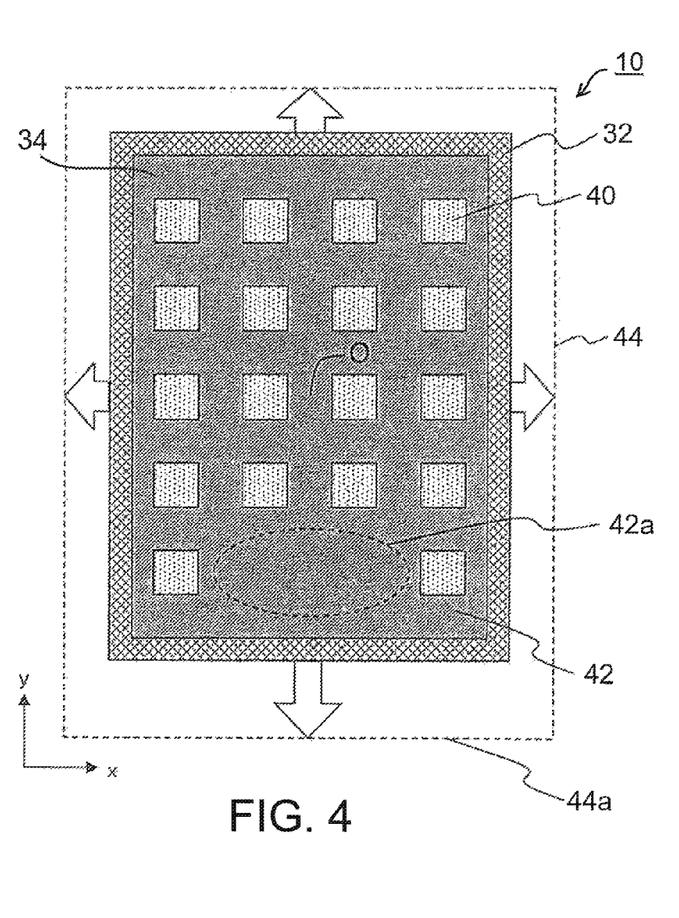
FIG. 4 is an enlarged plan view illustrating a detailed configuration of a reticle in a second related art.

FIG. 4 is an enlarged plan view illustrating a detailed configuration of the photo mask (the reticle) 10 (the rectangular exposure region 34 enclosed with the dark band 32) in a second related art.

The photo mask (the reticle) 10 of the second related art is similar in structure to the photo mask (the reticle) 10 of the first related art illustrated in FIG. 3 except that the exposure region 34 is modified from that illustrated in FIG. 3 as will later become clear. Specifically, in contract to the exposure region 34 in the photo mask (the reticle) 10 of the first related art, the exposure region 34 in the photo mask (the reticle) 10 of the second related art includes a dark portion 42a having a large area at a lower portion thereof.

It will be assumed that a radiation beam is irradiated to the reticle (the photo mask) 10 including the exposure region 34 according to the second related art during exposure. Under the circumstances, in the reticle substrate 30, as shown in arrows of FIG. 4, the dark band 32 and the rectangular exposure region 34 enclosed therewith expand up to a rectangular region 44 depicted at a broken line of FIG. 4. In this event, the lower portion of the exposure region 34 expands by a larger amount in comparison with other portions. This is because, inasmuch as the exposure region 34 includes the dark portion 42a having the large area at the lower portion thereof, the radiation beam is absorbed in the dark portion 42a having the large area to generate heat more than the other portions. Accordingly, the reticule substrate 30 (FIG. 2) expands at a lower portion thereof up to a maximum portion 44a of the enlarged amount of the reticle substrate.

If there is a bias in an arrangement distribution of the dark region 42 on the reticle 10 like the reticle (the photo mask) 10 including the exposure region 34 according to the second related art, the amount of absorption heating is biased and the alignment accuracy becomes worse due to a biased expansion of the reticle substrate 30 (FIG. 2).

[Related Art 3]

Figure 5:
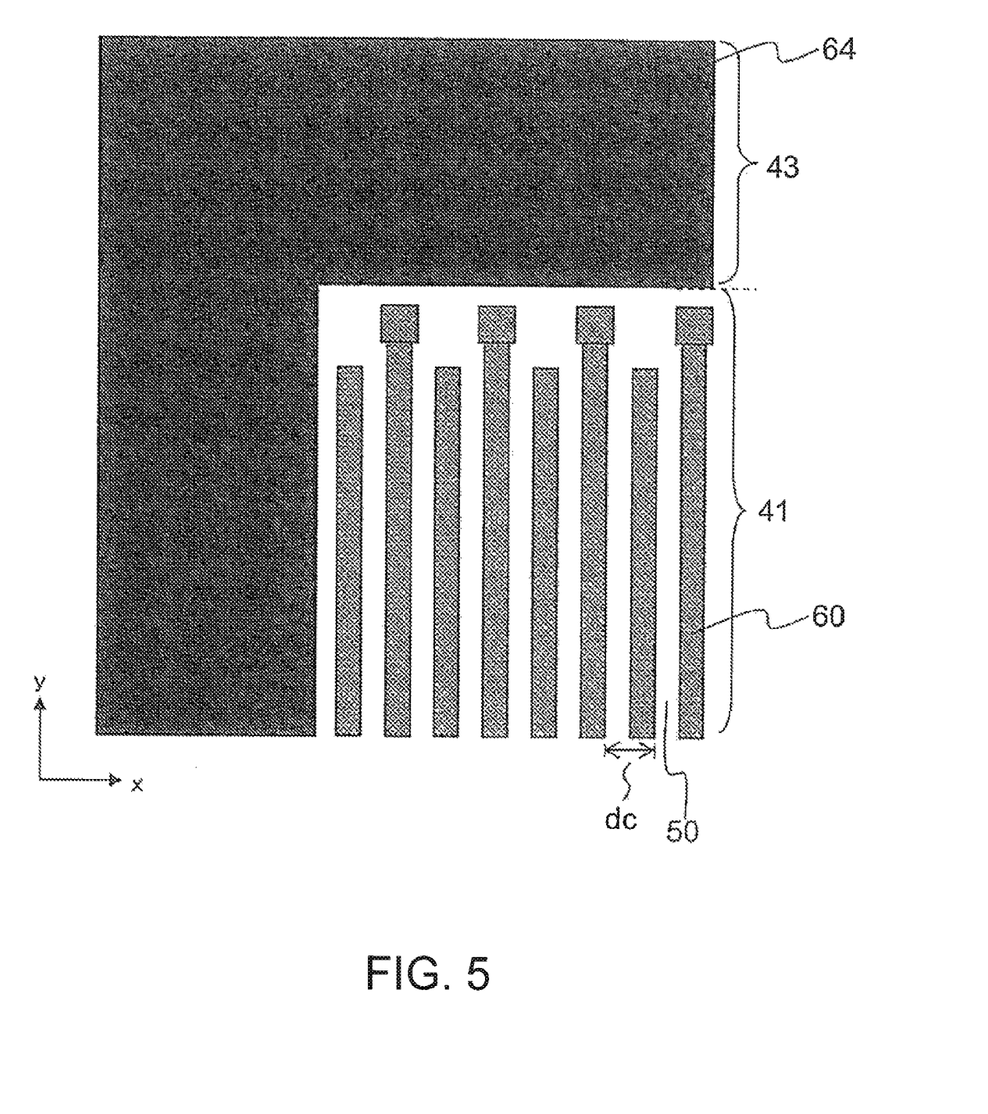
FIG. 5 is an enlarged plan view illustrating by enlarging a part of a reticle in a third related art.

FIG. 5 is an enlarged plan view illustrating by enlarging a part (a boundary portion between a circuit formation region (a first region) 41 and a dark region (a second region) 43) of a photo mask (a reticle) in a third related art.

In the photo mask (the reticle) of the third related art, a plurality of first dark patterns 60 are arranged in the circuit formation region (the first region) 41 at a first distance 50. On the other hand, the whole area of the dark region (the second region) 42 is covered with a second dark pattern 64.

It is impossible to suppress the thermal expansion of the reticle substrate 30 (FIG. 2) due to the above-mentioned absorption heating of the radiation beam in the photo mask (the reticle) of the third related art. This is because the whole area of the dark region (the second region) 43 is covered with the second dark pattern 64.

[Related Art 4]

Figure 6:
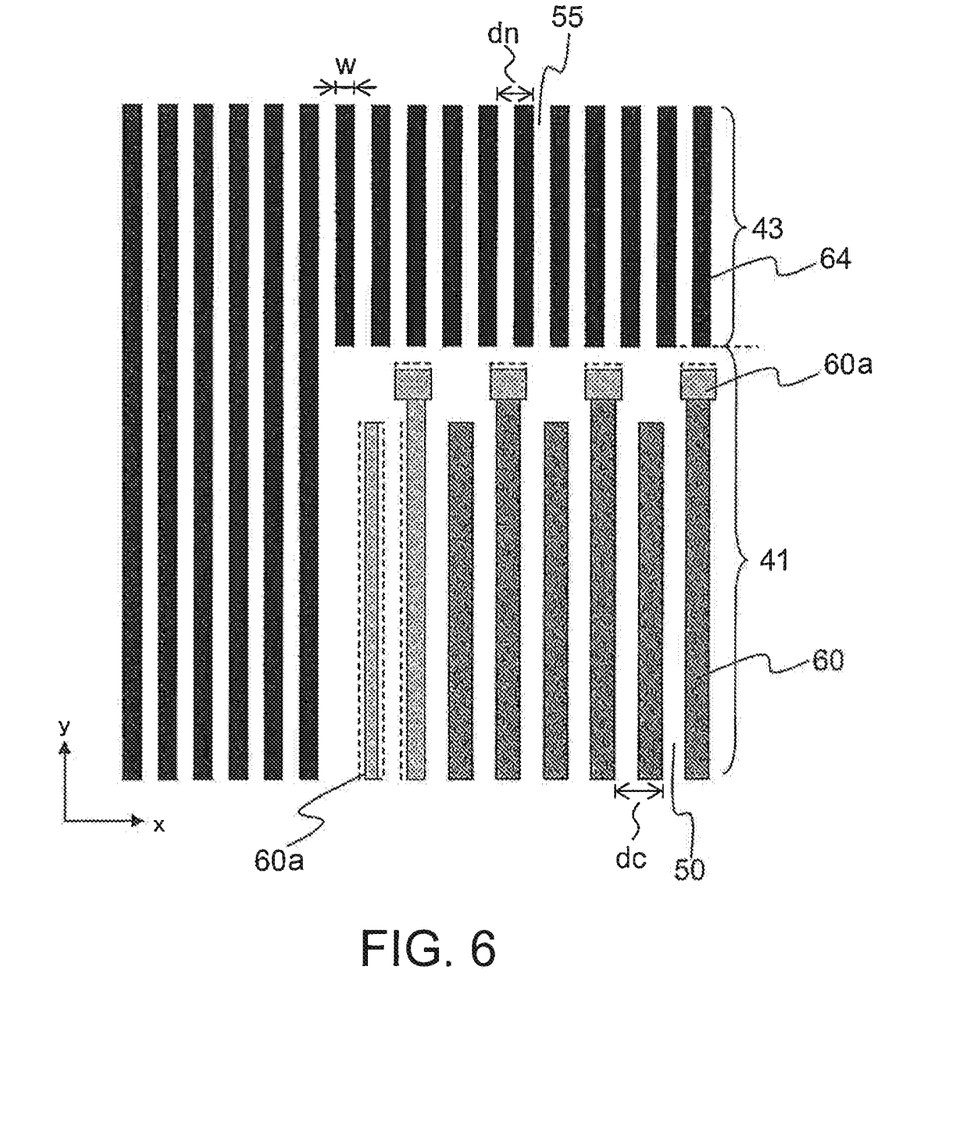
FIG. 6 is an enlarged plan view illustrating by enlarging a part of a reticle in a fourth related art.

FIG. 6 is an enlarged plan view illustrating by enlarging a part (a boundary portion between a circuit formation region (a first region) 41 and a dark region (a second region) 43) of a photo mask (a reticle) in a fourth related art. The photo mask (the reticle) of the fourth related art corresponds to the lithography mask disposed in the above-mentioned Patent Literature 2.

In the photo mask (the reticle) of the fourth related art, a plurality of first dark patterns 60 are arranged in the circuit formation region (the first region) 41 at a first distance 50 (at a first pitch dc) in the manner as the photo mask (the reticle) of the above-mentioned third related art. On the other hand, a plurality of second dark patterns 64 are arranged in the dark region (the second region) 43 at a second distance (at a second pitch dn). The second distance 55 (the second pitch dn) is narrower than the first distance 50 (the first pitch dc).

More specifically, arranged in the dark region (the second region) 43, each of the plurality of second dark patterns 64 has a line shape of a first width w extending in the y direction (the first direction) and the plurality of second dark patterns 64 are periodically arranged at the second distance 55 (the second pitch dn) in the x direction (the second direction) intersecting the y direction (the first direction).

Inasmuch as the plurality of second dark patterns 64 formed in the dark region (the second region) 43 have a small pattern pitch of the second pitch dn, the pattern is not resolved (transferred) in the photoresist (the photosensitive organic film) on the wafer 20 (FIG. 1). Accordingly, the pattern formed in the dark region (the second region) 43 is called a "non-resolution dummy pattern".

On contrast with this, inasmuch as the plurality of first dark patterns 60 formed in the circuit formation region (the first region) 41 have a larger pattern pitch of the first pitch dc, the pattern is resolved (transferred) in the photoresist (the photosensitive organic film) on the wafer 20 (FIG. 1). Accordingly, the pattern formed in the circuit formation region (the first region) 41 is called a "resolution pattern".

For reference sake, the circuit formation region (the first region) 41 corresponds to "the second patterning region" of the above-mentioned Patent Literature 2 while the dark region (the second region) 43 corresponds to "the first patterning region" of the above-mentioned Patent Literature 2.

It is possible to suppress the thermal expansion of the reticle substrate 30 due to the above-mentioned absorption heating of the radiation beam in the photo mask (the reticle) of the fourth related art. This is because the plurality of second dark patterns 64 in the dark region (the second region) 43 are arranged at the second distance 55 (the second pitch dn).

However, in the circuit formation region (the first region) 41, exposure locally becomes excess in proximity of the dark region (the second region) 43 due to diffraction of light (optical proximity) of the non-resolution dummy pattern formed in the dark region (the second region) 43. As a result, the problem arises because dimensional accuracy becomes worse in the pattern 60a transferred to the photoresist (the photosensitive organic film) on the wafer 20 (FIG. 1) as shown in a broken line of FIG. 6.

That is, it is impossible to prevent a detrimental effect due to the optical proximity in the photo mask (the reticle) of the fourth related art.

It is an object of this invention to provide a reticle which is capable of suppressing the thermal expansion of the reticle substrate 30 (FIG. 2) and which is capable of preventing such as a detrimental effect due to the optical proximity.

Now, the description will proceed to exemplary embodiments of the present invention with reference to figures.

Exemplary Embodiment 1

Figure 7:
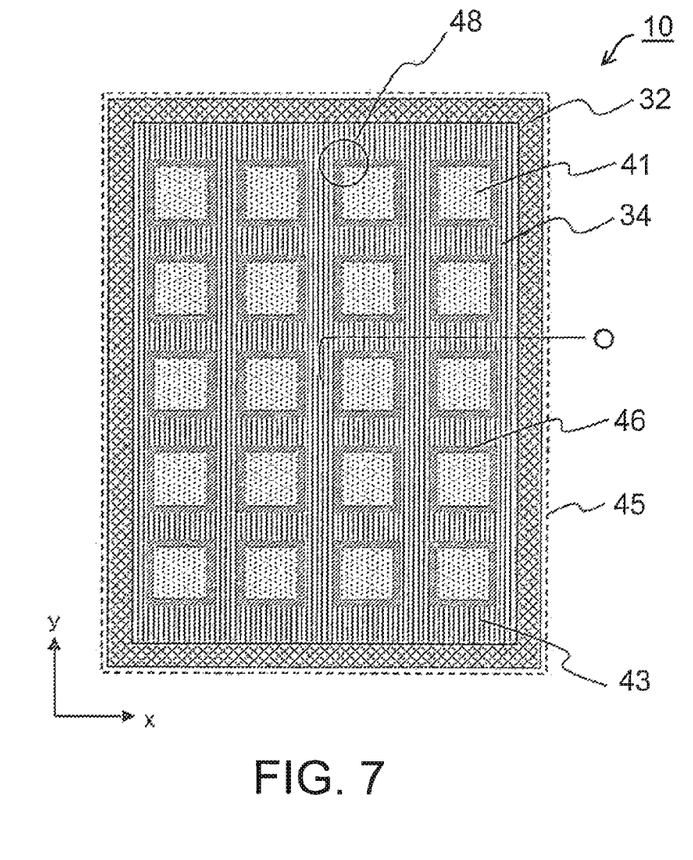
FIG. 7 is an enlarged plan view illustrating a detailed configuration of a reticle according to a first exemplary embodiment of this invention.

FIG. 7 is an enlarged plan view illustrating a detailed configuration of a photo mask (a reticle) (a rectangular exposure region 34 enclosed with a dark band 32) according to a first exemplary embodiment of this invention.

The exposure region 34 of the photo mask (the reticle) according to the first exemplary embodiment comprises a plurality of circuit formation regions 41, a dark region 43, and a plurality of dark portions 46. The plurality of circuit formation regions 41 are disposed at regular intervals in length and width directions (the y direction and the x direction) in a matrix fashion. The dark portion region 43 is disposed apart from the plurality of circuit formation regions 41. The plurality of dark portions 46 are disposed between the plurality of circuit formation regions 41 and the dark region 43 so as to enclose each circuit formation region 41. That is, each circuit formation region 41 is enclosed with the dark portion 46. In other words, the dark portion 46 is adjacent to the circuit formation region 41.

In the exposure region 34 of the photo mask (the reticle) according to the first exemplary embodiment, the plurality of the circuit formation regions 41 are arranged so as to be symmetric with respect to the central point O of the reticle substrate 30 (FIG. 2). In the example being illustrated, each circuit formation region 41 has a rectangular shape. Each dark portion 46 enclosing the circuit formation region 41 has a rectangular ring shape. In this connection, the circuit formation region 41 is also called a first region, the dark region 43 is also called a second region, and the dark portion 46 is also called a shield region. In addition, the dark portion (the shield region) 46 is also called a third region or a dark region.

As is evident from contradistinction to the exposure region 34 of the photo mask (the reticle) of the first related art illustrated in FIG. 3, the exposure region 34 of the photo mask (the reticle) according to the first exemplary embodiment differs from it in a way where the dark portions (the shield regions) 46 are provided at boundaries between the circuit formation regions (the first regions) 41 and the dark region (the second region) 43.

Figure 9:
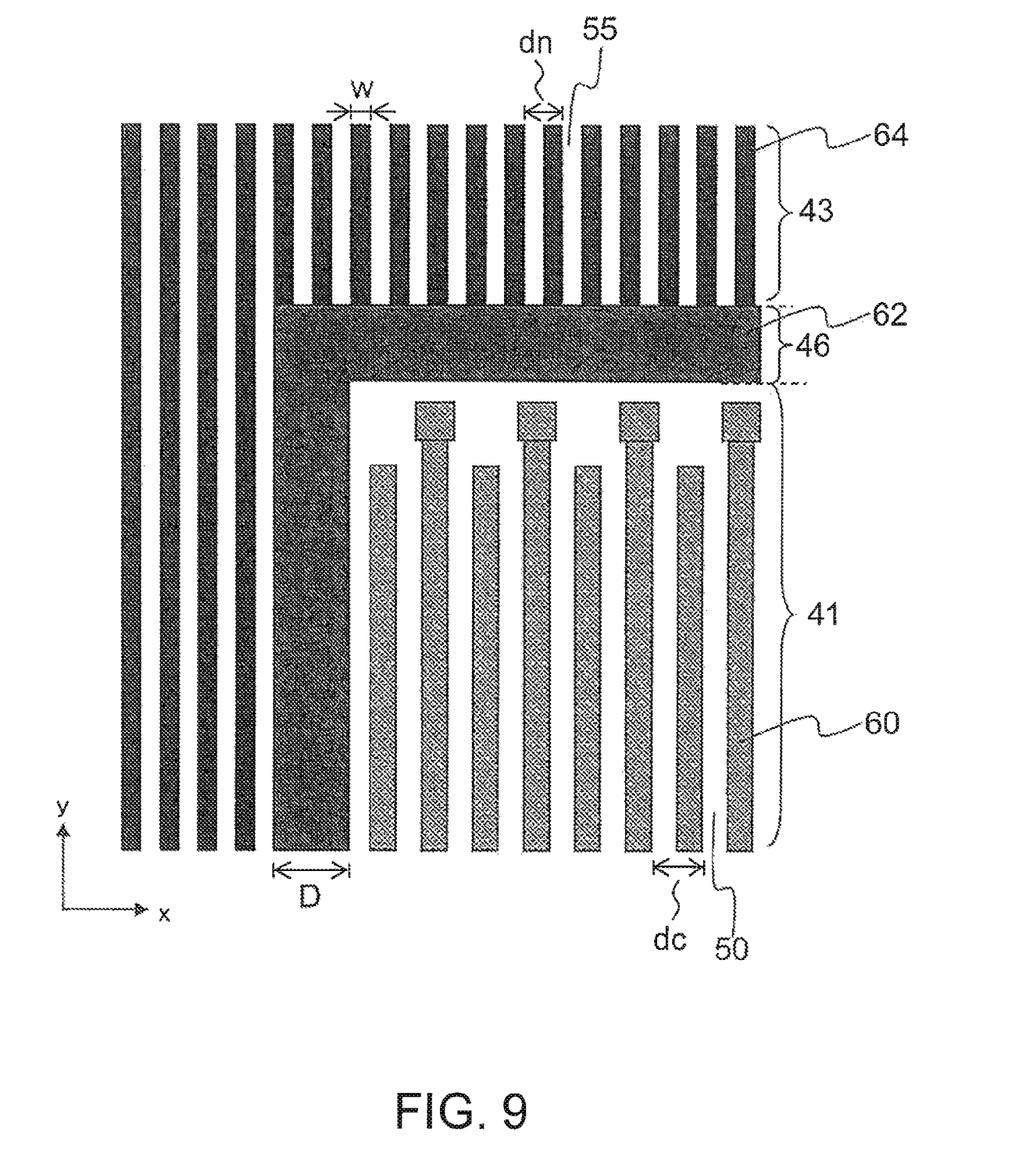
FIG. 9 is an enlarged plan view illustrating a reticle according to a first example of this invention, by enlarging a region 48 circled in FIG. 7.

FIG. 9 is an enlarged plan view of a portion of a region 48 circled in FIG. 7, by enlarging it.

As shown in FIG. 9, a plurality of dark patterns 60, 62, and 64 are disposed on the transparent substrate 30. In the circuit formation region (the first region) 41, the dark patterns 60 are disposed with a wider space than the first distance 50. The whole area of the dark portion (the shield region) 46 is covered with the dark pattern 62. In the dark region (the second region) 43, the dark patterns 64 are disposed with a narrower space than the second distance 55. The dark region (the second region) 43 is opposed to the circuit formation region (the first region) 41 with the dark portion (the shield region) 46 sandwiched therebetween. The second distance 55 is narrower than ninety present of the first distance 50.

More specifically, the photo mask (10) according to the first exemplary embodiment comprises: the plurality of dark patterns (60, 62, 64) disposed on the transparent substrate (30), the first, the shield, and the second regions (41, 46, 43) disposed on the transparent substrate (30), wherein the first region (41) includes the dark patterns (60) that are disposed with the wider space than the first distance (50), the shield region (46) is adjacent to the first region (41) and is filled with the dark pattern (62), the second region (43) is faced to the first region (41) across the shield region (46) and includes the dark patterns (64) that are disposed with the narrower space than the second distance (55), and wherein the second distance (55) is narrower than ninety percent of the first distance (50).

In the manner which is described above, the pattern formed in the circuit formation region (the first region) 41 is called the "resolution pattern" while the pattern formed in the dark region (the second region) 43 is called the "non-resolution dummy pattern." In addition, the pattern formed in the dark portion (the shield region) 46 is called a "dark pattern."

It will be assumed that a radiation beam is irradiated to the reticle (the photo mask) 10 including the exposure region 34 according to the first exemplary embodiment during exposure. Under the circumstances, in the reticle substrate 30 (FIG. 2), the dark band 32 and the rectangular exposure region 34 enclosed therewith expand uniformly in the length and width directions (the y direction and the x direction) up to a rectangular region 45 depicted at a broken line of FIG. 7. The rectangular region 45 depicted at the broken line is an enlarged amount of the reticle substrate. The reason why the reticle substrate 30 expands uniformly in the length and width directions is that the plurality of circuit formation regions 41 are disposed so as to be symmetric with respect to the central point O.

As is evident from contradistinction to the photo mask 10 of the first related art illustrated in FIG. 3, it is understood that, in the photo mask 10 according to the first exemplary embodiment, the enlarged amount 45 of the reticle substrate is remarkably less than the enlarged amount 44 of the reticle substrate. This is because, inasmuch as the non-resolution dummy pattern is formed in the dark region (the second region) 43, it is possible to suppress the thermal expansion of the reticle substrate 30 due to the above-mentioned absorption heating of the radiation beam.

Furthermore, in the photo mask 10 according to the first exemplary embodiment, it is possible to prevent a detrimental effect due to the above-mentioned optical proximity in the photo mask (the reticle) 10. This is because the dark portion (the shield region) 46 covered with dark pattern 62 in its entirety is provided between the circuit formation region (the first region) 41 and the dark region (the second region) 43, and it is therefore possible to avoid the optical proximity.

Exemplary Embodiment 2

Figure 8:
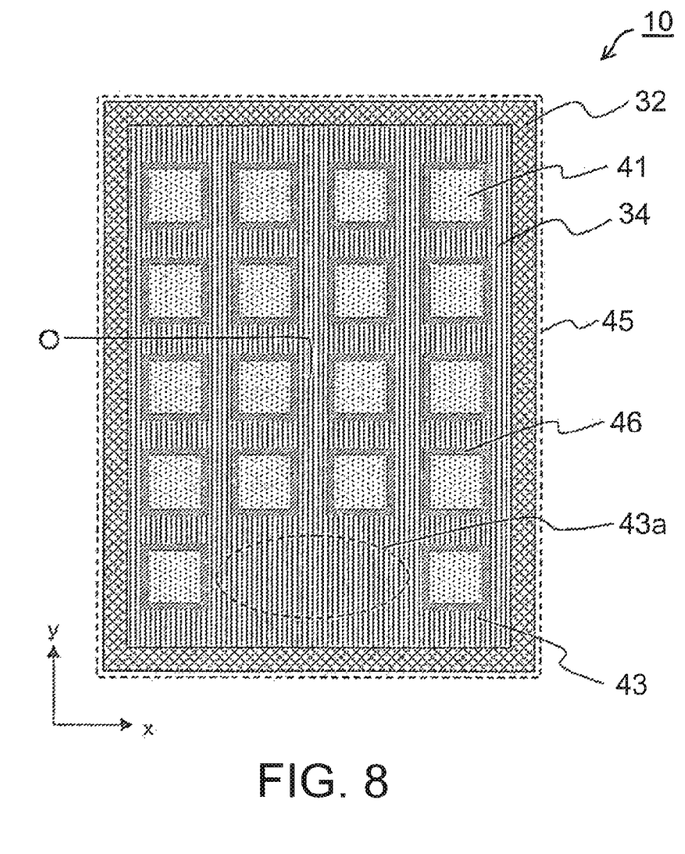
FIG. 8 is an enlarged plan view illustrating a detailed configuration of a reticle according to a second exemplary embodiment of this invention.

FIG. 8 is an enlarged plan view illustrating a detailed configuration of a photo mask (a reticle) 10 (a rectangular exposure region 34 enclosed with a dark band 32) according to a second exemplary embodiment of this invention.

The photo mask (the reticle) 10 of the second exemplary embodiment is similar in structure to the photo mask (the reticle) 10 of the first exemplary embodiment illustrated in FIG. 7 except that the exposure region 34 is modified from that illustrated in FIG. 7 as will later become clear. Specifically, in contract to the exposure region 34 in the photo mask (the reticle) 10 of the first exemplary embodiment, the exposure region 43 in the photo mask (the reticle) 10 of the second exemplary embodiment includes a dark portion 43a having a large area at a lower portion thereof.

It will be assumed that a radiation beam is irradiated to the reticle (the photo mask) 10 including the exposure region 34 according to the second exemplary embodiment during exposure. Under the circumstances, in the reticle substrate 30, the dark band 32 and the rectangular exposure region 34 enclosed therewith expand uniformly in the length and width directions (the y direction and the x direction) up to a rectangular region 45 depicted at a broken line of FIG. 8. This is because, inasmuch as the non-resolution dummy pattern is also formed in the dark portion 43a having the large area, it is therefore possible to suppress the thermal expansion of the reticle substrate 30 (FIG. 2) due to the above-mentioned absorption heating of the radiation beam.

In addition, in the photo mask 10 according to the second exemplary embodiment also, it is possible to prevent a detrimental effect due to the above-mentioned optical proximity.

Now, the description will proceed to examples of this invention with reference to drawings in detail.

Example 1

Referring to FIG. 9, the description will proceed to a reticle (a photo mask) according to a first example of this invention. FIG. 9 is the enlarged plan view illustrating the reticle according to the first example of this invention, by enlarging the region 48 (i.e. a boundary portion of the first region, the second region, and the third region) circled in FIG. 7

The reticle according to the first example comprises a transparent substrate 30 which includes a circuit formation region (a first region) 41, a dark region (a second region) 43, and a dark portion (a third region) 46 surrounding the circuit formation region (the first region) 41. The dark portion (the third region) 46 is adjacent to the circuit formation region (the first region) 41. The dark region (the second region) 43 is faced to the circuit formation region (the first region) 41 across the dark portion (the third region) 46. The dark portion (the third region) 46 is also called a dark region.

Then, the reticle according to the first example comprises first dark patterns 60 each having a line shape, second dark patterns 64 each having a line shape, and a third dark pattern 62. The first dark patterns are arranged with a first pitch dc in the circuit formation region (the first region) 41. The second dark patterns 64 are arranged with a second pitch dn in the dark region (the second region) 43. The third dark pattern 62 fills in the dark portion (the third region) 46 as a whole. In the manner which will later be described, the second pitch dn is narrower the ninety percent of the first pitch dc.

Therefore, the reticle or the photo mask (10) according to the first example comprises: the transparent substrate (30) including the first, the second and the third regions (41, 43, 46), the third region (46) adjacent to the first region (41), the first and the second regions (41, 43) facing each other across the third region (46); the first dark patterns (60) having the line shape that are arranged with the first pitch (dc) in the first region (41); the second dark patterns (64) having the line shape that arranged with the second pitch (dn) in the second region (43); and the third dark pattern (62) filling in the third region (46), wherein the second pitch (dn) is narrower than ninety percent of the first pitch (dc).

In other words, the photo mask (10) according to the first example comprises: the first region (41) including first cleat portions having a minimum size; the dark region (46) surrounding the first region (41); and the second region (43) surrounding the dark region (46) and including second clear portions having a maximum size that is smaller than ninety present of at least the minimum size.

In the first example, each of the first dark patterns 60, the second dark patterns 64, and the third dark pattern 62 has an equal transmittance for an designed wavelength $\lambda$ of light that is less than ten percent.

Disposed in the dark region (the second region) 43, each second dark pattern 64 has a line shape extending in the y direction (the first direction) with the first width w, and the second dark patterns 64 are arranged periodically at the second distance 55 (the second pitch dn) in the x direction (the second direction) that intersects the y direction (the first direction).

In the first example, a non-resolution dummy pattern with the second pitch dn exceeding resolution limitations of lithography is arranged as the non-resolution dummy pattern formed in the dark region (the second region) 43, and it is therefore possible to put a larger non-resolution dummy pattern in the dark region (the second region) 43 without causing the photoresist (the photosensitive organic film) on the wafer 20 (FIG. 1) to resolve an unnecessary pattern. Herein, it will be assumed that exposure condition has the designed wavelength $\lambda$ of light in the light source 2 (FIG. 1), a numerical aperture NA of the wafer 20 (FIG. 1) side, a coherent factor $\sigma$ ($\sigma_{out}$, $\sigma_{in}$) of illumination, and a transferred factor M. In this event, it is possible to calculate the second pitch dn using the following Rayleigh's equation.

$$dn < 0.5 \lambda / M(NA \times \sigma_{out})$$

In the first example, an AfF excimer laser having the designed wavelength $\lambda$ of light of 193 nm is used as the light source 2 (FIG. 1), the numerical aperture NA of the wafer 20 (FIG. 1) side is equal to 0.92, the transferred factor M is equal to a quarter (¼), and the coherent factor $\sigma$ of the illumination is equal to ($\sigma_{out}/\sigma_{in}$=0.95/0.76). Therefore, in the first example, the second pitch dn is set to 424 nm, which exceeds the resolution limitations of the Rayleigh's equation.

The second pitch dn of the 424 nm in the dark region (the second region) 42 corresponds to a pitch of 106 nm on the wafer 20 (FIG. 1) because the pitch is reduced to (¼).

In addition, in the first example, the first pitch dc of the resolution pattern formed in the circuit formation region (the first region) 41 is set to 498 nm. The first pitch dc corresponds to a pitch of 124.5 nm on the wafer 20 (FIG. 1).

Accordingly, in the first example, the pitch ratio of (the non-resolution dummy pattern)/(the resolution pattern) is equal to 0.85-fold. However, inasmuch as the second pitch dn calculated by the above-mentioned Rayleigh's equation has a lower limit equal to 441.6 nm, the above-mentioned pitch ratio is actually less than 0.887. Therefore, in the first example, due to rounding, the second pitch dn is set to be narrower than ninety percent of the first pitch dc.

Therefore, a method of manufacturing a semiconductor device according to the first example comprises: forming a work layer on the semiconductor substrate (20); forming the photosensitive organic film on the work layer; exposing the photosensitive organic film on the semiconductor substrate (20) using, as a mask, the photo mask (10) in which the desired dark patterns (60, 62, 64) are arranged; developing the exposed photosensitive organic film to form a first pattern in which part of the photosensitive organic film is selectively removed; and selectively removing the work layer using the first pattern as a mask, wherein the photo mask (10) comprises the first through the third regions (41, 43, 46), the dark patterns (60) are arranged in the first region (41) with a wider distance (50) where the pattern is transferred to the photosensitive organic film, the third region (46) surrounds the first region (41) and is covered with the dark pattern (62) as a whole, the dark patterns (64) are arranged in the second region (46) with a narrower distance (55) where the pattern is not transferred to the photosensitive organic film, and the second region (46) faces to the first region (41) across the third region (46).

In addition, in the first example, in each of the first pitch dc and the second pitch dn, the ratio of a width dimension of a line to a width dimension of a space is equal to 1:1. As a result, in the first example, the first distance 50 is equal to 249 nm while the second distance 55 is equal to 212 nm. Accordingly, the second distance 55 is narrower than ninety percent of the first distance 50.

In the manner as described above, the second distance 55 is 0.5-fold of the second pitch dn in the first example. However, it is possible to determine the first width (size) w of each second dark pattern 64 as follows. That is, the first width (size) w of each second dark pattern 64 is calculated by changing the second distance (slit size) 55 of the reticle 10 with the second pitch dn calculated by the above-mentioned Rayleigh's equation, and making the second distance (the slit size) 55 of the largest slit size within a range where decline does not occur in the photoresist (the photosensitive organic film) a manufacturing condition of the non-resolution dummy pattern. By carrying out experiment under the above-mentioned exposure condition and a condition of the above-mentioned Rayleigh's equation, the first width (the size) of each second dark pattern 64 was determined to 188 nm.

However, the second distance (the slit size) 55 may range from forty present to sixty percent of the pitch (the second pitch dn) of the second dark pattern 64 which is defined as the sum of the first width w and the second distance 55.

In addition, in the first example, a distance D is calculated as follows. The distance D is a distance between the circuit formation region (the first region) 41 and the dark region (the second region) 43 which face each other across the dark portion (the shield region) 46. More specifically, in order to avoid the optical proximity for the circuit formation region (the first region) 41, the distance D is changed to calculate a distance so as to have little effect on the circuit formation region (the first region) 41 and so that the non-resolution dummy pattern is not arranged within this region. This distance D was calculated using a lithography simulator under the above-mentioned exposure condition and the condition of the above-mentioned Rayleigh's equation. As a result, four micrometers was obtained as the distance D.

Accordingly, the distance D may be not less than four micrometers. However, if the distance D is large too far, an area of the dark portion in the reticle substrate 30 enlarges and then it is impossible to suppress the thermal expansion of the reticle substrate 30 (FIG. 2) due to the absorption heating of the radiation beam. Hence, in the first example, the distance D was set so as to range from four micrometers to twenty micrometer.

Furthermore, in the first example, the reticle substrate (the mask substrate) 30 (FIG. 2) is made of a material of quartz which has a transmittance to the designed wavelength λ of light more than eighty-five percent.

The reticle having structure of FIG. 9 that is formed in the manner as described above was made a product and twenty-five wafers was continuously exposed by using the exposure apparatus illustrated in FIG. 1. The present inventor confirmed that the non-resolution dummy pattern arranged in the dark region (the second region) 43 does not form unnecessary resist pattern to the semiconductor manufacture.

Similarly, the reticle having structure of FIG. 6 also was made a product and twenty-five wafers were continuously exposed.

Figure 10:
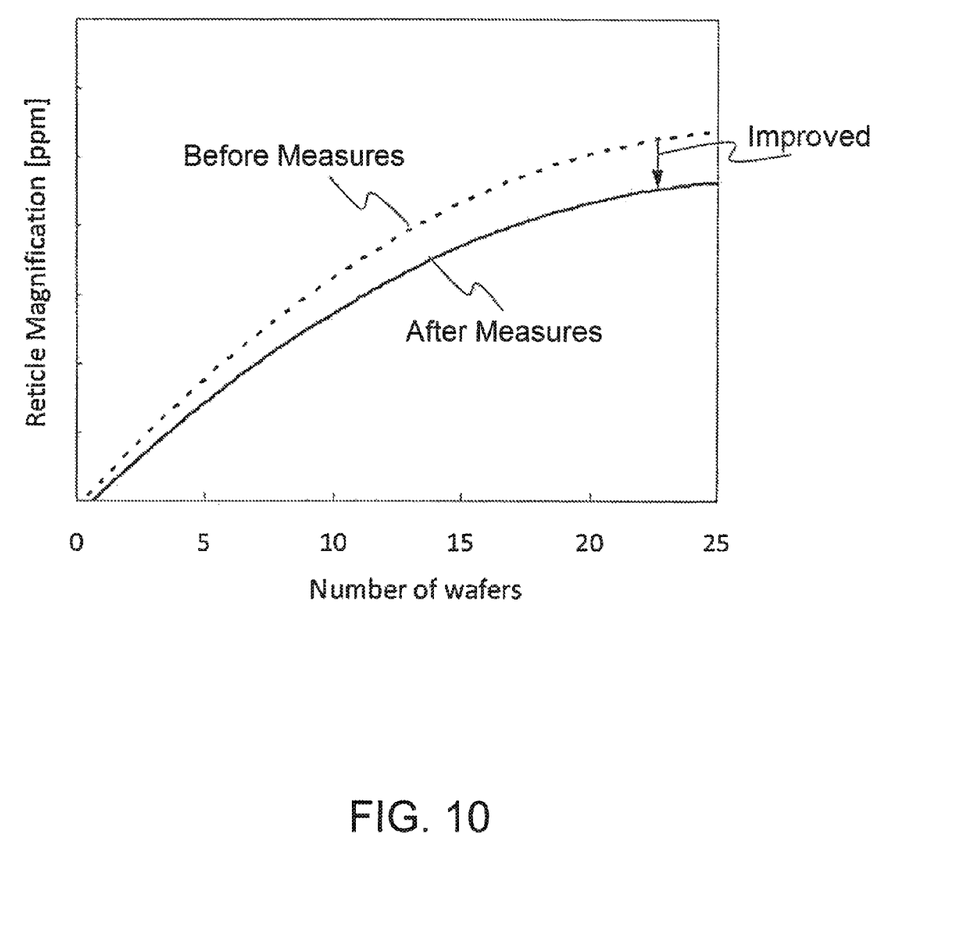
FIG. 10 is a graph for use in describing an effect of the reticle according to the first example illustrated in FIG. 9, in contradistinction to the reticle in the fourth related art illustrated in FIG. 6.

FIG. 10 is a graph showing those results. In FIG. 10, the abscissa represents number of wafers 20 and the ordinate represents reticle magnification [ppm]. Furthermore, in FIG. 10, a solid line represents the results (after measures) in a case of using the reticle having the structure of FIG. 9 while a broken line represents the results (before measures) in a case of using the reticle having the structure of FIG. 6.

From FIG. 10, it is understood that, in both of the results (after measures) and the results (before measures), shifts of the reticle magnification increase in accordance with an increase of the number of the wafers 20 which are continuously exposed. This is factors where the reticle substrate 30 expands due to the absorption heating of the dark portion of the reticle 10 and the reticle substrate 30 expands unequally so that residual components of the shifts of the reticle magnification increase because there is bias in a distribution within a shot of the dark portion.

In addition, from FIG. 10, it is understood that the residual components of the shifts of the reticle magnification decrease (are improved) so that the bias in the distribution of the dark portion is reduced in the results (after measures) of the first example in contradistinction to the results (before measures). This is because it is possible to prevent a detrimental effect due to the optical proximity because the dark portion (the shied region) 46 covered with the dark pattern 62 over the full range thereof is disposed between the circuit formation region (the first region) 41 and the dark region (the second region) 43. Accordingly, it is understood that the effects become manifest the larger the number of wafers continuously exposed becomes.

Example 2

Figure 11:
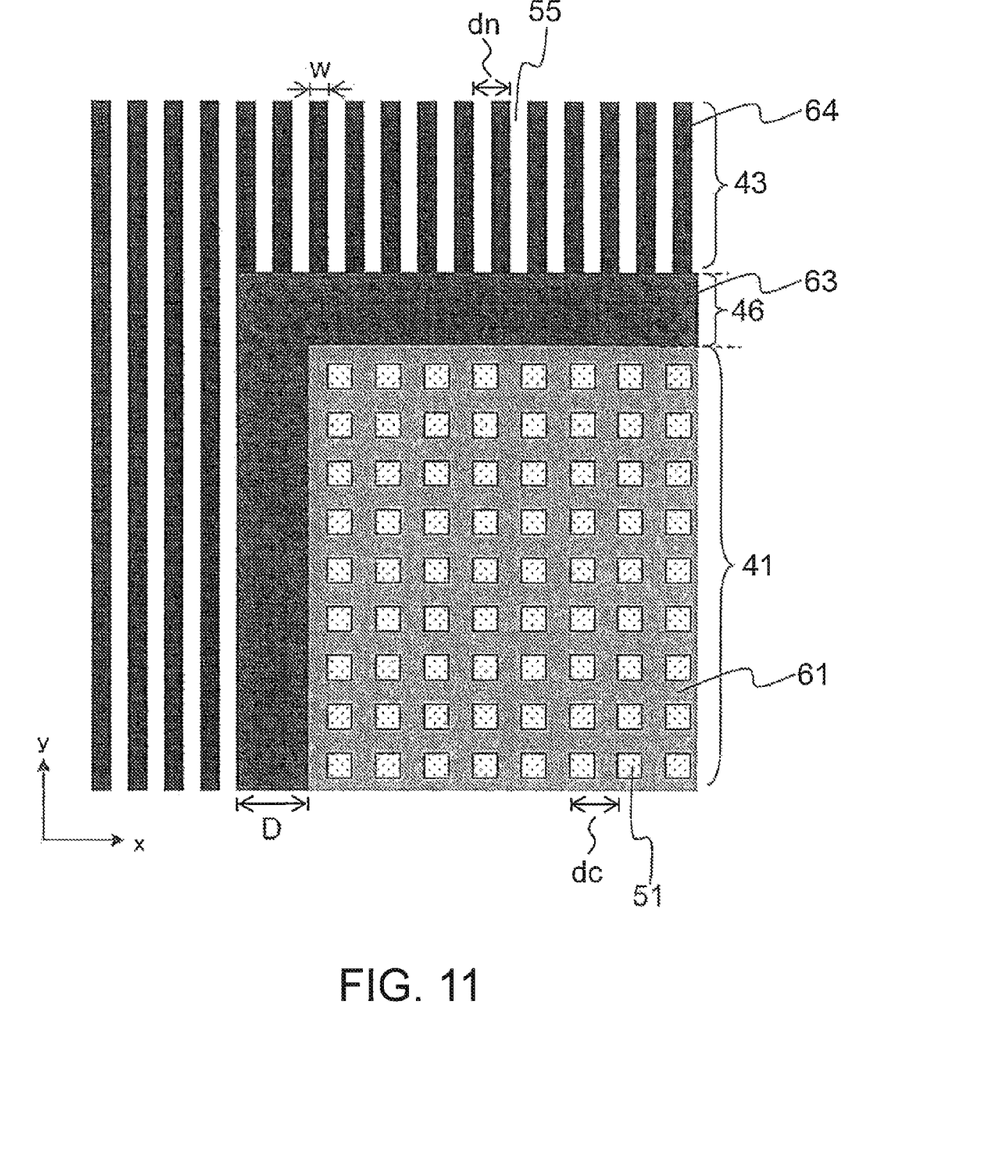
FIG. 11 is an enlarged plan view illustrating a reticle according to a second example of this invention, by enlarging a region 48 circled in FIG. 7.

Referring to FIG. 11, the description will proceed to a reticle (a photo mask) according to a second example of this invention. FIG. 11 is the enlarged plan view illustrating the reticle according to the second example of this invention, by enlarging the region 48 (i.e. a boundary portion of the first region, the second region, and the third region) circled in FIG. 7.

The reticle according to the second example comprises a transparent substrate 30 which includes a circuit formation region (a first region) 41, a dark region (a second region) 43, and a dark portion (a shied region or a third region) 46 surrounding the circuit formation region (the first region) 41. The dark portion (the shield region or the third region) 46 is adjacent to the circuit formation region (the first region) 41. The dark region (the second region) 43 is faced to the circuit formation region (the first region) 41 across the dark portion (the shield region or the third region) 46.

The reticle according to the second example is similar in structure to the reticle according to the first example illustrated in FIG. 9 except that the resolution pattern formed in the circuit formation region (the first region) 41 is modified from that illustrated in FIG. 9 as will later become clear.

More specifically, the reticle according to the second example comprises first dark patterns 61, second dark patterns 64 each having a line shape, and a third dark pattern 63. The first dark patterns 61 are arranged with a first pitch dc in the circuit formation region (the first region) 41 in the manner which will later become clear. The second dark patterns 64 are arranged with a second pitch dn in the dark region (the second region) 43. The third dark pattern 63 fills in the dark portion (the shield region or the third region) 46 as a whole. The second pitch dn is narrower the ninety percent of the first pitch dc.

A plurality of clear rectangle patterns are arrayed periodically in the circuit formation region (the first region) 41. The first circuit formation region (the first region) 41 has a first distance 51 which is defined by a short side length of the clear rectangle pattern enclosed with the first dark pattern 61 at periphery thereof.

Therefore, the reticle (10) according to the second example comprises: the transparent substrate (30) including the first, the second and the third regions (41, 43, 46), the third region (46) adjacent to the first region (41), the first and the second regions (41, 43) facing each other across the third region (46); the first dark patterns (61) that are arranged with the first pitch (dc) in the first region (41); the second dark patterns (64) having the line shape that arranged with the second pitch (dn) in the second region (43); and the third dark pattern (63)

filling in the third region (46), wherein the second pitch (dn) is narrower than ninety percent of the first pitch (dc).

In the second example, each of the first dark patterns 61, the second dark patterns 64, and the third dark pattern 63 has an equal transmittance for an designed wavelength λ of light that is less than ten percent.

Inasmuch as constructions other than this are similar in structure to those of the reticle according to the first example illustrated in FIG. 9, the description of them will be omitted.

The present inventor confirmed that improvement as shown in FIG. 10 is made in the reticle according to the second example also as in the case of the reticle according to the above-mentioned first example.

Example 3

Figure 12:
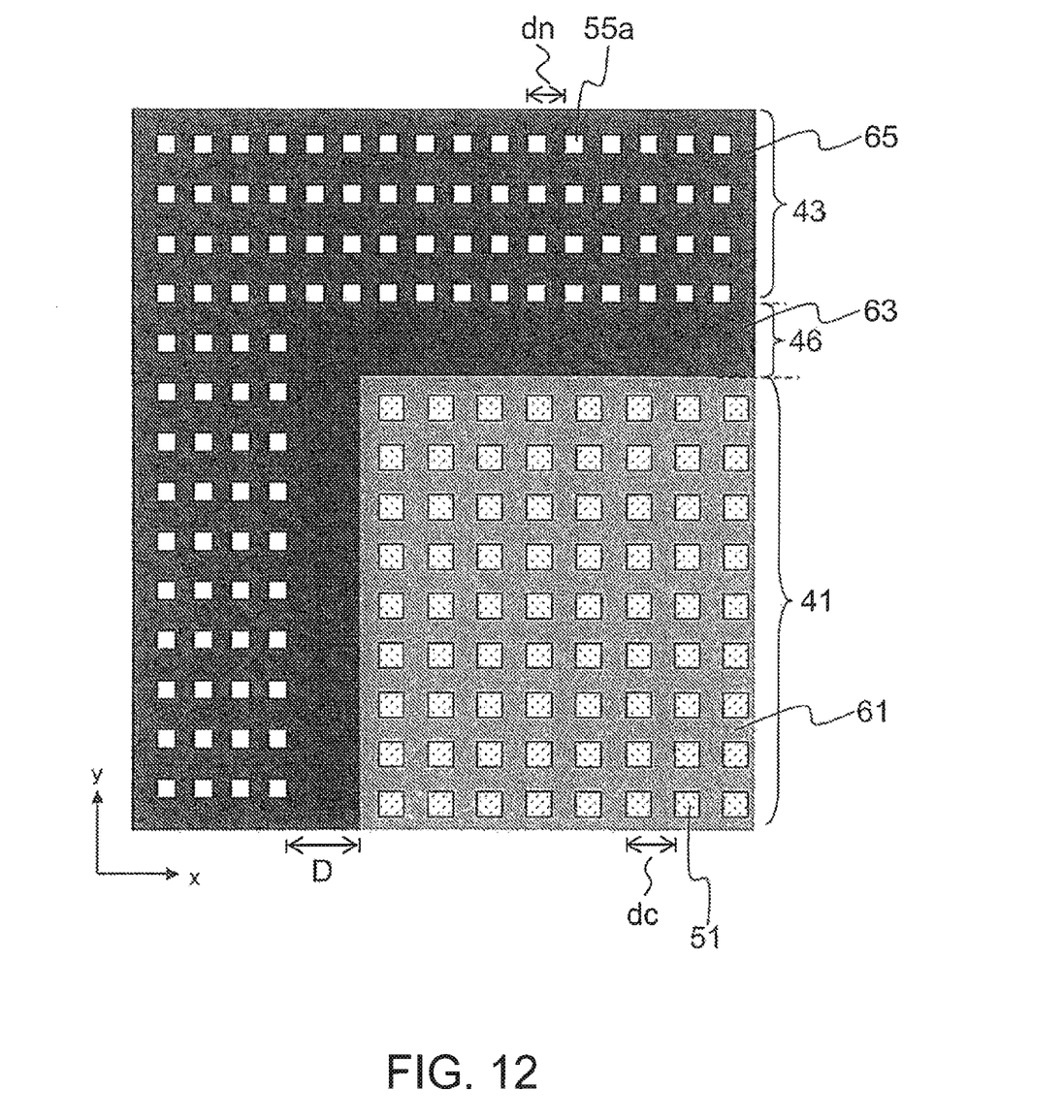
FIG. 12 is an enlarged plan view illustrating a reticle according to a third example of this invention, by enlarging a region 48 circled in FIG. 7.

Referring to FIG. 12, the description will proceed to a reticle (a photo mask) according to a third example of this invention. FIG. 12 is the enlarged plan view illustrating the reticle according to the third example of this invention, by enlarging the region 48 (i.e. a boundary portion of the first region, the second region, and the third region) circled in FIG. 7.

The reticle according to the third example comprises a transparent substrate 30 which includes a circuit formation region (a first region) 41, a dark region (a second region) 43, and a dark portion (a shied region or a third region) 46 surrounding the circuit formation region (the first region) 41. The dark portion (the shield region or the third region) 46 is adjacent to the circuit formation region (the first region) 41. The dark region (the second region) 43 is faced to the circuit formation region (the first region) 41 across the dark portion (the shield region or the third region) 46.

The reticle according to the second example is similar in structure to the reticle according to the second example illustrated in FIG. 11 except that the non-resolution dummy pattern formed in the dark region (the second region) 43 is modified from that illustrated in FIG. 11 as will later become clear.

More specifically, the reticle according to the third example comprises first dark patterns 61, second dark patterns 65, and a third dark pattern 63. The first dark patterns 61 are arranged with a first pitch dc in the circuit formation region (the first region) 41. The second dark patterns 65 are arranged with a second pitch dn in the dark region (the second region) 43 in the manner which will later become clear. The third dark pattern 63 fills in the dark portion (the shield region or the third region) 46 as a whole. The second pitch dn is narrower the ninety percent of the first pitch dc.

A plurality of clear rectangle patterns are arrayed periodically in the dark region (the second region) 43. The dark region (the second region) 43 has a second distance 55a which is defined by a short side length of the clear rectangle pattern enclosed with the second dark pattern 65 at periphery thereof.

A total area of the plurality of clear rectangle patterns arrayed periodically occupies from forty percent to sixty percent within the area of the dark region (the second region) 43.

Therefore, the reticle (10) according to the third example comprises: the transparent substrate (30) including the first, the second and the third regions (41, 43, 46), the third region (46) adjacent to the first region (41), the first and the second regions (41, 43) facing each other across the third region (46); the first dark patterns (61) that are arranged with the first pitch (dc) in the first region (41); the second dark patterns (65) that arranged with the second pitch (dn) in the second region (43); and the third dark pattern (63) filling in the third region (46), wherein the second pitch (dn) is narrower than ninety percent of the first pitch (dc).

In the third example, each of the first dark patterns 61, the second dark patterns 65, and the third dark pattern 63 has an equal transmittance for an designed wavelength λ of light that is less than ten percent.

Inasmuch as constructions other than this are similar in structure to those of the reticle according to the second example illustrated in FIG. 11, the description of them will be omitted.

The present inventor confirmed that improvement as shown in FIG. 10 is made in the reticle according to the third example also as in the case of the reticle according to the above-mentioned first example.

Embodiment

Figure 13:
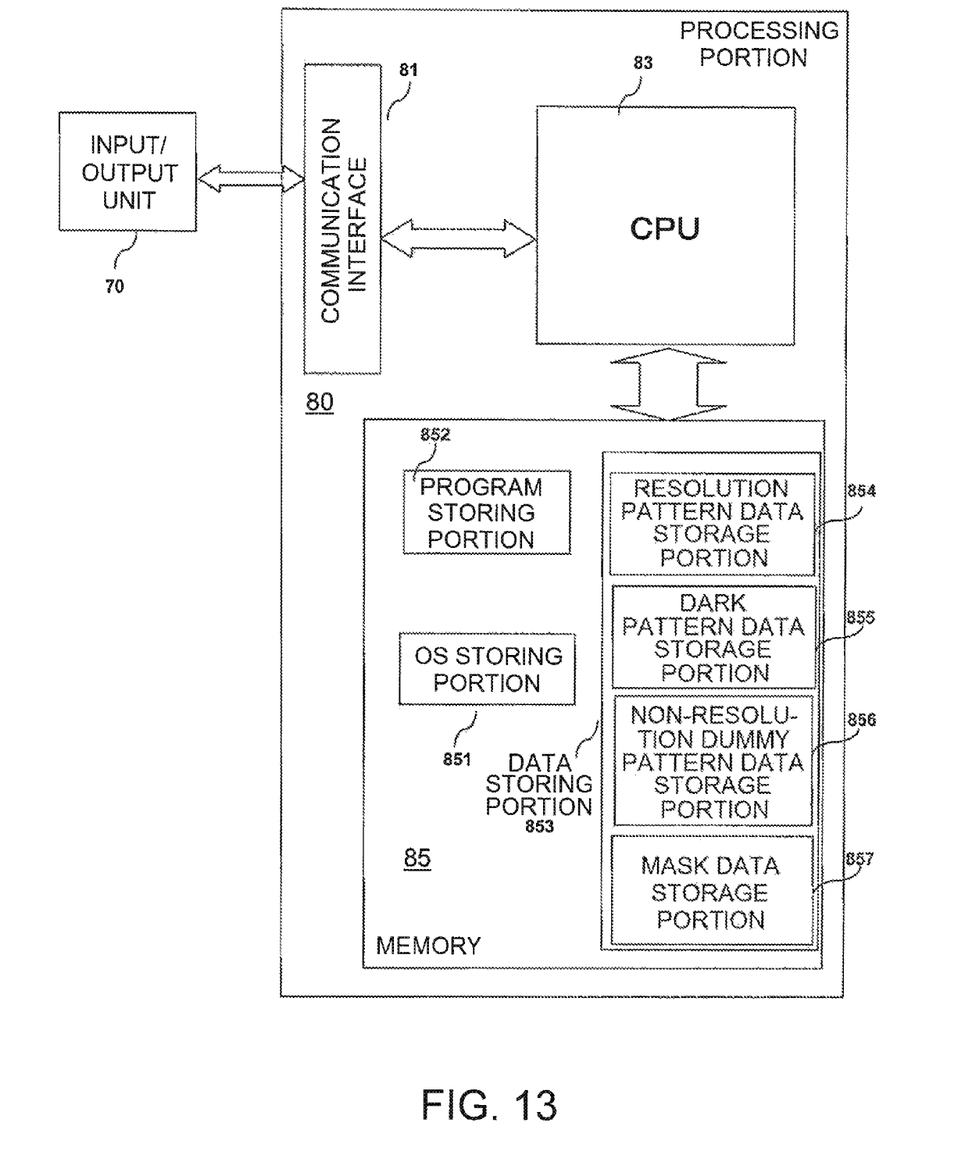
FIG. 13 is a block diagram illustrating a configuration of a mask data preparing apparatus according to an exemplary embodiment of this invention.

Referring to FIG. 13, the description will proceed to a mask data preparing apparatus according to an exemplary embodiment of this invention. The mask data preparing apparatus prepares mask data. The illustrated mask data preparing apparatus comprises an input/output unit 70 such as a keyboard, a display unit, and so on, and a processing portion (that is, a computer) 80. The processing portion 80 is composed of a communication interface 81, a central processing unit (CPU) 83, and a memory 85. The memory 85 includes an OS storing portion 851 for storing an operating system (OS), a program storing portion 852 for storing a program executing a predetermined operation, and a data storing portion 853.

The data storing portion 835 stores various kinds of data supplied from the input/output unit 70. The illustrated data storing portion 853 comprises a resolution pattern data storage portion 854, a dark pattern data storage portion 855, a non-resolution dummy pattern data storage portion 856, and a mask data storage portion 857.

The CPU 83 processes, in a predetermined procedure, the resolution pattern data, the dark pattern data, and the non-resolution dummy pattern data from the data storing portion 835 in accordance with the program stored in the program storing portion 852, and stores the mask data obtained by a result of the processing in the mask data storage portion 857.

The mask data stored in the mask data storage portion 857 is appropriately read to the outside via the communication interface 81 in accordance with a command from the input/output unit 70. It goes without saying that the program storing portion 852 comprises a computer readable recording medium for storing the program executing the predetermined operation. Furthermore, this invention covers the reticle made by using the mask data prepared by the above-mentioned method and a semiconductor device manufactured by using the mask in question.

While the invention has been particularly shown and described with reference to exemplary embodiments thereof, the invention is not limited to these embodiments. It will be understood by those of ordinary skill in the art that various changes in form and details may be made therein without departing from the sprit and scope of the present invention as defined the claims.

INDUSTRIAL APPLICABILITY

This invention can be applied not only to the formation of a semiconductor integrated circuit but also to the formation of other devices such as a display element, for example, a liquid crystal panel, or the like.

What is claimed is:

1. A photo mask comprising:
   a plurality of dark patterns disposed on a transparent substrate;
   a first region including the dark patterns that are disposed with a wider space than a first distance;
   a shield region, adjacent to the first region on the transparent substrate, being filled with the dark pattern; and
   a second region, faced to the first region across the shield region, including the dark patterns that are disposed with a narrow space than a second distance,
   wherein the second distance is narrower than ninety percent of the first distance.

2. The photo mask according to claim 1, wherein each of the dark patterns in the second region, has a line shape extending in a first direction with a first width, and arranged periodically with the narrower space in a second direction that intersects the first direction.

3. The photo mask according to claim 1, further comprising:
   a first pitch defined by a total of the first width and the second distance, wherein the second distance ranges from forty percent to sixty percent of the first pitch.

4. The photo mask according to claim 1, wherein the second distance is defined by a narrower width of a clear rectangle pattern surrounded by the dark pattern.

5. The photo mask according to claim 4, wherein a plurality of the clear rectangle patterns are arrayed periodically so as to fill in the second region.

6. The photo mask according to claim 5, wherein a total area of the plurality of the clear rectangle patterns occupies from forty percent to sixty percent within the area of the second region.

7. The photo mask according to claim 1, wherein a distance between the first region and the second region facing each other across the shield region, ranges from four micrometers to twenty micrometers.

8. The photo mask according to claim 1, wherein the transparent substrate is quartz having a transmittance to a designed wavelength of light more than eighty-five percent.

9. A photo mask comprising:
   a transparent substrate including first, second, and third regions, the third region adjacent to the first region, the first and the second regions facing each other across the third region;
   first dark patterns that are arranged with a first pitch in the first region;
   second dark patterns that are arranged with a second pitch in the second region; and
   a third dark pattern filling in the third region,
   wherein the second pitch is narrower than ninety percent of the first pitch.

10. The photo mask according to claim 9, wherein each of the first, the second, and the third dark patterns is a partial transmittance layer.

11. The photo mask according to claim 10, wherein the partial transmittance layer has a transmittance less than ten percent to a designed wavelength of light.

12. The photo mask according to claim 11, wherein the second dark patterns are non-resolution patterns to the designed wavelength of light.

13. A photo mask comprising:
   a first region including a plurality of first clear portions having a minimum size;
   a dark region surrounding the first region; and
   a second region surrounding the dark region and including a plurality of second clear portions having a maximum size that is smaller than ninety percent of at least the minimum size.

14. The photo mask according to claim 13, wherein each of the plurality of second cleat portions has a line shape.

15. The photo mask according to claim 13, further comprising a dark portion in the second region, wherein each of the plurality of second clear portions has a rectangle shape that is surrounded with the dark portion.

16. The photo mask according to claim 14, further comprising a dark portion in the second region, wherein the plurality of second clear portions are arranged periodically so as to form a tripe pattern with the dark portion.

17. The photo mask according to claim 15, wherein the plurality of second clear portions are arranged in an array.

18. The photo mask according to claim 13, wherein a total area of the plurality of second clear portions occupies from forty present to sixty present within the area of the second region.

19. The photo mask according to claim 13, further comprising a transparent substrate including the first region, the dirk region, and the second region.

20. The photo mask according to claim 13, wherein the first region faces to the second region across the dark region.

* * * * *